(12) United States Patent
Citla et al.

(10) Patent No.: US 10,570,506 B2
(45) Date of Patent: *Feb. 25, 2020

(54) METHOD TO IMPROVE FILM QUALITY FOR PVD CARBON WITH REACTIVE GAS AND BIAS POWER

(71) Applicant: Applied Materials, Inc., Santa Clara, CA (US)

(72) Inventors: Bhargav Citla, Fremont, CA (US); Jingjing Liu, Milpitas, CA (US); Zhong Qiang Hua, Saratoga, CA (US); Chentsau Ying, Cupertino, CA (US); Srinivas D. Nemani, Sunnyvale, CA (US); Ellie Y. Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/820,777

(22) Filed: Nov. 22, 2017

(65) Prior Publication Data

US 2018/0209037 A1 Jul. 26, 2018

Related U.S. Application Data

(60) Provisional application No. 62/449,928, filed on Jan. 24, 2017.

(51) Int. Cl.
*C23C 14/00* (2006.01)
*C23C 14/06* (2006.01)
(Continued)

(52) U.S. Cl.
CPC .......... *C23C 14/35* (2013.01); *C23C 14/0036* (2013.01); *C23C 14/0605* (2013.01);
(Continued)

(58) Field of Classification Search
CPC . C23C 14/35; C23C 14/0605; C23C 14/0611; C23C 14/3485; C23C 14/0036;
(Continued)

(56) References Cited

U.S. PATENT DOCUMENTS

| 6,344,419 B1 * | 2/2002 | Forster | C23C 14/046 118/696 |
| 8,585,873 B2 * | 11/2013 | Ford | C23C 14/35 204/192.12 |

(Continued)

FOREIGN PATENT DOCUMENTS

| JP | 63067721 A | * | 3/1988 |
| KR | 10-1174946 B1 | | 8/2012 |

OTHER PUBLICATIONS

International Search Report and Written Opinion dated Apr. 23, 2018 for Application No. PCT/US2017/068538.

*Primary Examiner* — Michael A Band
(74) *Attorney, Agent, or Firm* — Patterson + Sheridan LLP

(57) ABSTRACT

Embodiments of the present disclosure generally describe methods for depositing an amorphous carbon layer onto a substrate, including over previously formed layers on the substrate, using a high power impulse magnetron sputtering (HiPIMS) process, and in particular, biasing of the substrate during the deposition process and flowing a nitrogen source gas and/or a hydrogen source gas into the processing chamber in addition to an inert gas to improve the morphology and film stress of the deposited amorphous carbon layer.

13 Claims, 5 Drawing Sheets

(51) Int. Cl.
  *C23C 14/34* (2006.01)
  *C23C 14/35* (2006.01)
  *H01J 37/34* (2006.01)
  *H01L 21/02* (2006.01)
  *H01L 21/033* (2006.01)

(52) U.S. Cl.
  CPC ........ *C23C 14/345* (2013.01); *C23C 14/3485* (2013.01); *H01J 37/3408* (2013.01); *H01J 37/3467* (2013.01); *H01L 21/02115* (2013.01); *H01L 21/02266* (2013.01); *H01L 21/0332* (2013.01)

(58) Field of Classification Search
  CPC ..... C23C 16/50; C23C 16/272; C23C 14/345; H01J 37/3426; H01J 37/3455; H01J 37/3467; H01L 21/02266; H01L 21/02115
  See application file for complete search history.

(56) References Cited

U.S. PATENT DOCUMENTS

| | | | |
|---|---|---|---|
| 9,695,503 B2* | 7/2017 | Stowell | C23C 14/35 |
| 2009/0183992 A1* | 7/2009 | Fredenberg | B81C 99/0085 |
| | | | 205/82 |
| 2011/0011737 A1 | 1/2011 | Wu et al. | |
| 2013/0256125 A1* | 10/2013 | Young | C23C 14/3407 |
| | | | 204/298.06 |
| 2015/0348824 A1* | 12/2015 | Kuenle | C23C 14/0605 |
| | | | 257/506 |
| 2016/0053366 A1 | 2/2016 | Stowell et al. | |
| 2016/0372319 A1 | 12/2016 | Zeng et al. | |
| 2018/0051368 A1* | 2/2018 | Liu | C23C 14/0605 |

\* cited by examiner

METHOD TO IMPROVE FILM QUALITY FOR PVD CARBON WITH REACTIVE GAS AND BIAS POWER

CROSS-REFERENCE TO RELATED APPLICATIONS

This application claims priority to U.S. Provisional Application Ser. No. 62/449,928, filed on Jan. 24, 2017, which is herein incorporated by reference in its entirety.

BACKGROUND

Field

Embodiments of the present disclosure generally relate to methods used in semiconductor manufacturing, and more particularly, to methods used to deposit an amorphous carbon layer on a substrate in an electronic device fabrication process.

Description of the Related Art

Carbon hardmasks are well known and are commonly used in processes of record (POR) in semiconductor manufacturing. However, process issues caused by carbon hardmasks deposited using conventional methods are expected to increase as DRAM and NAND continue their scaling down to under ~10 nm regimes which will require higher aspect ratio etching of device features, such as deep contact holes or trenches. High aspect ratio etch issues including clogging, hole-shape distortion, pattern deformation, top critical dimension blow up, line bending, and profile bowing are generally a result of undesirable material properties of conventionally deposited carbon hardmasks. For example, etching using lower density hardmasks, and/or etching using a hardmask material having poor thermal conductivity, are known to result in increased deformation of high aspect ratio features when compared to etching using higher density hardmasks and/or etching using hardmask materials with higher thermal conductivity. Likewise, etching using hardmask materials having lower etch selectivity and/or a higher film stress are known to result in increased slit pattern deformation and/or line bending when compared to etching using hardmask materials with higher etch selectivity and/or lower film stress. Therefore, it is desirable to have a carbon hardmask with higher density, higher etch selectivity, lower stress, and higher thermal conductivity than currently provided by conventional carbon hardmask deposition methods.

Amorphous carbon layers deposited using physical vapor deposition (PVD) methods are known to have desirably higher density and higher etch resistance compared to carbon films deposited using chemical vapor deposition (CVD) methods. Higher etch resistance makes PVD deposited amorphous carbon layers a good hardmask material for 3D NAND etch applications where very high aspect ratio etch requires hardmask materials with lower etch rates when compared to the etch rate of the underlying substrate material. However, conventional PVD deposited amorphous carbon materials typically have undesirably higher roughness, poorer morphology, lower refractive index, higher absorption coefficient (optical K), and increased film stress when compared to CVD deposited amorphous carbon layers. Roughness is a key factor affecting the local critical dimension (CD) uniformity, i.e., the uniformity in the dimensions of etched features over a small local area such as less than one square cm, and the shape of the etched features. Hardmask materials having a high refractive index and/or a higher absorption coefficient (optical K) and therefore reduced transparency, may undesirably require additional alignment steps when they are patterned by lithography. Etching using hardmask materials with poorer morphology, such as an undesirable columnar morphology, is more likely to result in deformation in high aspect ratio features. High stress is undesirable in a hardmask material layer, because it is challenging to integrate a high stress hardmask with other materials and/or integration of the high stress hardmask material negatively affects subsequent photolithography processes.

Accordingly, what is needed in the art are improved methods of depositing amorphous carbon hardmask layers.

SUMMARY

Embodiments of the present disclosure generally describe methods for depositing an amorphous carbon layer onto a substrate, including over previously formed layers on the substrate, using a high power impulse magnetron sputtering (HiPIMS) process.

In one embodiment, a method of depositing an amorphous carbon layer is provided. The method includes positioning a substrate on a substrate support disposed in a processing volume of a processing chamber and flowing a processing gas into the processing volume. Herein, the processing gas comprises an inert gas and a reactive gas comprising hydrogen, nitrogen, or a combination thereof. The method further includes providing a pulsed DC power to a target disposed in the processing volume, forming a plasma of the processing gas, providing a bias power to a bias electrode disposed in the substrate support, and depositing an amorphous carbon layer on the substrate.

In another embodiment, a method of depositing an amorphous carbon layer is provided. The method includes positioning a substrate on a substrate support disposed in a processing volume of a processing chamber. Herein, the processing chamber comprises one or more sidewalls, a chamber bottom, and a lid assembly which define the processing volume. The lid assembly comprises a target bonded to a metallic backing plate, a magnetron housing coupled to the metallic backing plate, wherein the metallic backing plate and the magnetron housing define a housing volume, a magnetron assembly disposed in the housing volume, and a motor coupled to the magnetron assembly by a rotatable shaft. The method further includes flowing a processing gas into the processing volume where the processing gas comprising an inert gas of Ar, He, Ne, Kr, Xe, or combinations thereof, and a reactive gas including a hydrogen source gas, a nitrogen source gas, or a combination thereof. The method further includes moving the magnetron assembly about an axis disposed through the rotatable shaft at between about 10 rpm and about 200 rpm and providing a pulsed DC power to the target. Herein, the pulsed DC power has a voltage between about 1 MV and about 8 MV and an average power provided to the carbon target during the voltage pulse is between about 1 W/cm$^2$ and about 20 W/cm$^2$. The method further includes forming a plasma of the processing gas, providing a bias power to a bias electrode disposed in the substrate support, wherein the bias power is between about 0.0283 W/cm$^2$ and about 1.45 W/cm$^2$, maintaining the substrate at a temperature less than about 200° C., and depositing an amorphous carbon layer on the substrate.

In another embodiment, a method of forming an amorphous carbon hardmask is provided. The method includes positioning a substrate on a substrate support disposed in a processing volume of a processing chamber. Herein, the processing chamber comprising one or more sidewalls, a chamber bottom, and a lid assembly which define the processing volume. The lid assembly comprises a target bonded to a metallic backing plate and a magnetron housing coupled to the metallic backing plate, where the metallic backing plate and the magnetron housing define a housing volume. The lid assembly further includes a magnetron assembly disposed in the housing volume and a motor coupled to the magnetron assembly by a rotary shaft. The method further includes flowing a processing gas into the processing volume. Herein, the processing gas comprises an inert gas including Ar, He, Ne, Kr, Xe, or combinations thereof, and a reactive gas including a hydrogen source gas, a nitrogen source gas, or a combination thereof. The method further includes rotating moving the magnetron assembly about an axis disposed through the rotatable shaft at between about 10 rpm and about 200 rpm, providing a pulsed DC power to the target, wherein the pulsed DC power has a voltage between about 1 MV and about 8 MV, and wherein an average DC power provided to the target during a voltage pulse is between about between about 1 $W/cm^2$ and about 20 $W/cm^2$; and forming a plasma of the processing gas. The method further includes providing a bias power to a bias electrode disposed in the substrate support, herein the bias power is between about 0.0283 $W/cm^2$ and about 1.45 $W/cm^2$. The method further includes maintaining the substrate at a temperature less than about 200° C., depositing an amorphous carbon layer on the substrate, and thereafter depositing a patterning layer on the amorphous carbon layer. Herein, the patterning layer comprises silicon oxide, silicon nitride, or a combination thereof. The method further includes forming a plurality of openings through the patterning layer and forming a plurality of openings through the amorphous carbon layer.

In another embodiment, computer readable medium causing a method of depositing an amorphous carbon layer is provided. Herein, the method of depositing an amorphous carbon layer includes positioning a substrate on a substrate support disposed in a processing volume of a processing chamber, flowing a processing gas into the processing volume, providing pulsed DC power to a carbon target disposed in the processing volume, and forming a plasma of the processing gas. The method of depositing an amorphous carbon layer further includes providing a bias power to a bias electrode disposed in the substrate support and depositing the amorphous carbon layer on the substrate. In some embodiments, the processing chamber comprising one or more sidewalls, a chamber bottom, and a lid assembly which define the processing volume. In some embodiments, the lid assembly comprises a carbon target bonded to a metallic backing plate, a magnetron housing coupled to the metallic backing plate, wherein the metallic backing plate and the magnetron housing define a housing volume, a magnetron assembly disposed in the housing volume, and a motor coupled to the magnetron assembly by a rotatable shaft. Typically, the processing gas comprises an inert gas and a reactive gas comprising hydrogen, nitrogen, or a combination thereof. In some embodiments, the inert gas comprises Ar, He, Ne, Kr, Xe, or combinations thereof. In some embodiments, the reactive gas is selected from the group consisting of $H_2$, $CH_4$, $C_2H_2$, $C_3H_8$, $C_4H_{10}$, $C_2H_4$, $C_3H_6$, $C_4H_8$, and $C_6H_{10}$, or a combination thereof. In other embodiments, the reactive gas is $N_2$, $NH_3$, or a combination thereof. In some embodiments, the method further includes moving the magnetron assembly about an axis disposed through the rotatable shaft at between about 10 rpm and about 200 rpm. In some embodiments, the pulsed DC power comprises a voltage pulse between about 1 MV and about 8 MV, wherein an average DC power provided to the target during a pulse active time is between about between about 1 $W/cm^2$ and about 20 $W/cm^2$. In some embodiments, the bias power provided to the bias electrode is between about 0.0283 $W/cm^2$ and about 1.45 $W/cm^2$. In some embodiments, the method further includes maintaining the substrate at a temperature less than about 200° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
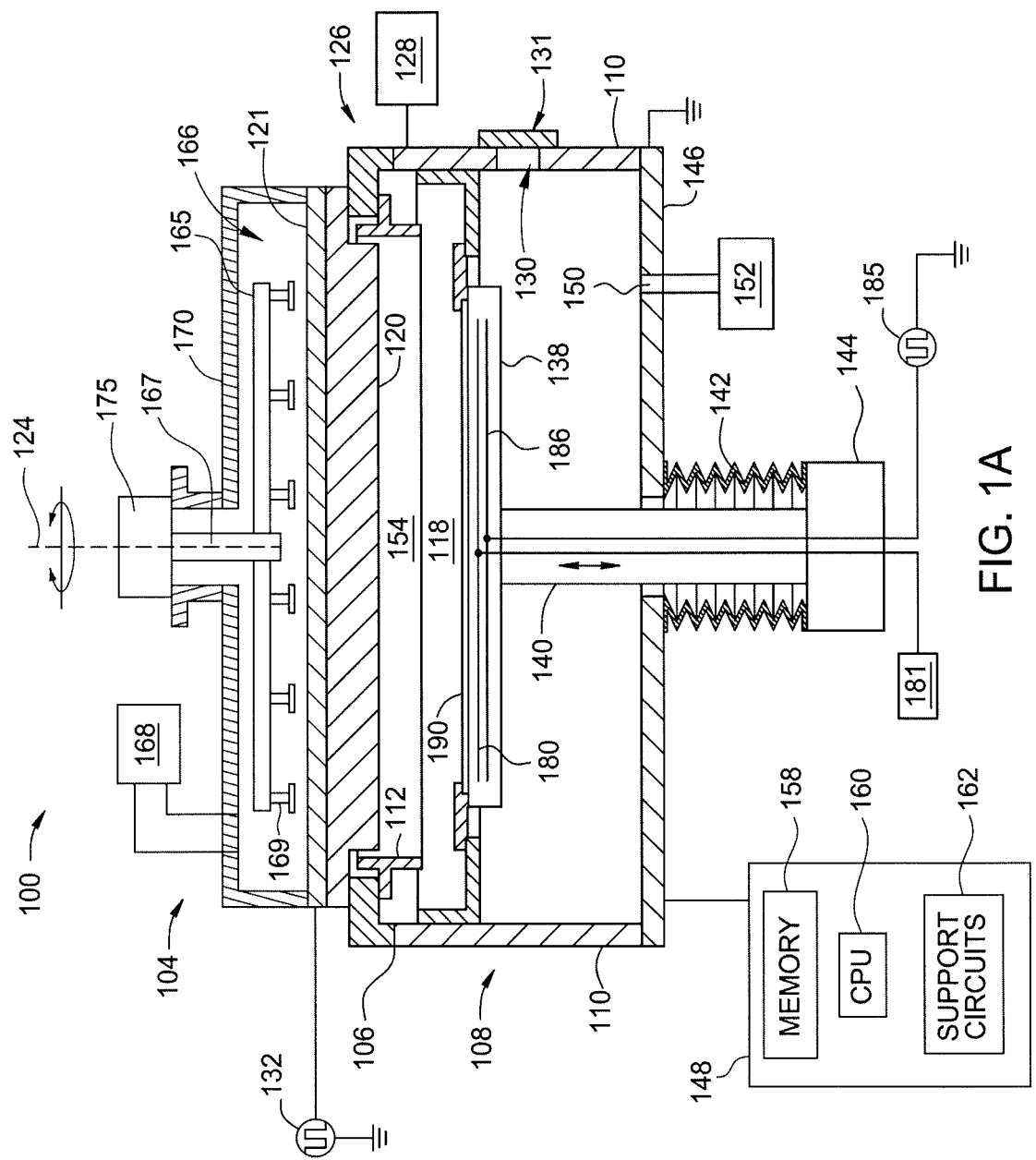
FIG. 1A is a schematic cross-sectional view of an example processing chamber used to practice the methods described herein, according to one embodiment.

Embodiments of the present disclosure generally describe methods for depositing an amorphous carbon layer onto a substrate, including over previously formed layers on the substrate, using a high power impulse magnetron sputtering (HiPIMS) process, while biasing the substrate during the deposition process and flowing a nitrogen source gas and/or a hydrogen source gas into the processing chamber in addition to an inert gas.

Typically, amorphous carbon layers deposited using conventional physical vapor deposition (PVD) processes have higher densities and etch resistance when compared to chemical vapor deposition (CVD) deposited amorphous carbon layers, both of which are desirable properties when used as a hardmask in the formation of high aspect ratio features. However, amorphous carbon layers deposited using conventional PVD typically have greater roughness, a more columnar morphology, a greater refractive index (n), and a higher absorption coefficient (optical K) and are therefore less transparent, and greater internal stress when compared to CVD deposited amorphous carbon layers, which are undesirable properties in a hardmask to be used in the formation of high aspect ratio features by etching through the hardmask.

Biasing the substrate desirably improves roughness and optical K (transparency), but increases film stress. Adding a hydrogen source gas, such as hydrogen or a hydrogenated carbon gas, or a nitrogen source gas, such as $N_2$ or $NH_3$, to an inert gas desirable reduces the roughness and desirably reduces film stress of the resulting film when compared to methods that use only an inert gas, such as Kr. Further, the combination of a hydrogen source gas and an inert gas, such as $H_2$ and Kr, improves optical K properties of the resulting film when compared to methods that use only an inert gas or use a hydrogen source gas and an inert gas. The combination of biasing and adding a hydrogen source gas or a nitrogen source gas during the deposition process results in an amorphous carbon layer with higher density, higher etch resistance, lower film roughness, and lower stress when compared to conventional PVD methods. Embodiments are more clearly described with reference to the figures below.

FIG. 1 is a schematic cross-sectional view of an example processing chamber, herein a high power impulse magnetron sputtering (HiPIMS) processing chamber 100, used to practice the methods described herein. The processing chamber 100 includes a chamber body 108 comprising one or more sidewalls 110, a chamber bottom 146, and a lid assembly 104, which define a processing volume 118. The processing volume is fluidly coupled to a gas source 128 which provides processing gases thereinto. A target 120, bonded to a metallic backing plate 121, is disposed in the lid assembly 104 which is coupled to a pulsed DC power supply, herein a first power supply 132, which when a pulse therefrom is imposed on the target 120 ignites a plasma from the processing gases in the processing volume 118 through capacitive coupling therewith. The processing volume 118 is fluidly coupled to a vacuum source, such as one or more dedicated vacuum pumps 152, through a vacuum outlet 150, to maintain the processing volume 118 at sub-atmospheric pressure and evacuates processing, and other gases, therefrom.

The processing chamber 100 further includes a substrate support 138 disposed in the processing volume 118 which is coupled to a support shaft 140 extending through the chamber bottom 146. A bellows 142 circumscribes the support shaft 140 and is coupled to the substrate support 138 and an actuator 144 to provide a flexible seal therebetween and to maintain the vacuum integrity of the processing volume 118. The support shaft 140 is also coupled to the actuator 144 that is configured to raise and lower the support shaft 140, and thus the substrate support 138 disposed thereon, to facilitate processing of a substrate 190 and transfer thereof to and from the processing chamber 100. Typically, when the substrate support 138 is in a raised or processing position, the substrate 190 is spaced apart from a surface of the target 120 by between about 20 mm and about 250 mm, such as between about 40 mm to 60 mm.

The substrate 190 is transferred into and out of the processing chamber 100 through an opening 130 formed through the sidewall 110, which is conventionally sealed with a door 131 or valve during the deposition process. In some embodiments, the processing chamber 100 is coupled to a transfer chamber and/or other chambers of a substrate processing system. Typically, a plurality of lift pins (not shown) are movably disposed through the substrate support 138 to facilitate transferring of the substrate 190 to and from the substrate support 138. When the substrate support 138 is in a lowered position the plurality of lift pins extend above the surface of the substrate support 138 thereby spacing the substrate 190 from the substrate support 138 for access by a robot handler. When the substrate support 138 is in a raised processing position the tops of the plurality of lift pins are located flush with, or below, the surface of the substrate support 138 and the substrate 190 rests directly on the substrate support 138 for processing. The relative position of the tops of the lift pins and the substrate receiving surface of the substrate support 138 can be changed by contact of their lower ends with a stationary or movable pin plate (not shown), or with the chamber bottom 146 of the processing chamber 100 as the substrate support 138 is lowering in the processing chamber 100.

During processing, the substrate 190 is secured to a surface of the substrate support 138 by means of an electrostatic attraction between the substrate and substrate support created by a power supplied to a chucking electrode 180 embedded in a dielectric material of the substrate support 138. The chucking electrode 180 is electrically coupled to a second power supply 181. Herein, the second power supply 181 is a static DC power supply which provides between about −5000 V and about 5000 V. The substrate support 138 herein further includes a bias electrode 186, disposed in the dielectric material thereof, which is electrically isolated from the chucking electrode 180 by the dielectric material of the substrate support 138 disposed therebetween. The bias electrode 186 is electrically coupled to a third power supply 185 which is herein an RF power supply that operates in a pulsing or continuous wave (CW) mode. In pulsing mode, the RF bias power provided to the bias electrode typically has a pulse width (pulse duration) of between about 10 μs and about 200 μs, such as between about 10 μs and about 100 μs, such as between about 10 μs and about 50 μs, for example between about 10 μs and about 25 μs. Herein, the pulsed RF bias power has a time on duty cycle between about 10% and about 90%, such as between about 30% and about 70%. Typically, the average RF bias power provided to the bias electrode in pulsing mode or in CW mode is between about 20 W and about 1000 W for a substrate support configured for a 300 mm diameter substrate, such as between about 20 W and about 500 W, for example about 150 W. Appropriate scaling may be used for substrate supports for different sized substrates where the RF bias power per $cm^2$ at a surface of the substrate 190 is between about 0.028 $W/cm^2$ and about 1.415 $W/cm^2$, such as between about 0.028 $W/cm^2$ and about 0.71 $W/cm^2$, for example about 0.21 $W/cm^2$.

In some embodiments, the substrate support 138 is further coupled to a cooling base (not shown) which is used to regulate the temperature of the substrate support 138, and the substrate 190 disposed on the surface thereof, during the deposition process. Typically, the cooling base includes one or more fluid conduits disposed therein which are in fluid communication with a coolant source (not shown) such as a refrigerant source or a temperature controlled fluid source.

The lid assembly 104 herein includes a magnetron housing 170 and a target 120 bonded to a metallic backing plate 121 which define a housing volume 166, a magnetron assembly 165 disposed in the housing volume 166, and a ground shield assembly 126 which electrically insulates the target 120, and the metallic backing plate 121 bonded thereto, from the sidewalls 110 of the chamber body 108. The magnetron assembly 165 herein includes a plurality of high strength magnets 169, such as neodymium iron boride magnets, arranged to provide a magnetic field which extends through the target 120 and into the processing volume 118. The magnetic field traps electrons along field lines to increase the plasma ions density by enabling additional electron-gas atom collisions. The negative bias on the target accelerates ions in the processing plasma toward the target where they strike the target to knock carbon atoms from the target 120 that can then deposit on the surface of the substrate 190 to form the amorphous carbon layers described herein. In one embodiment, a strength of the magnetic field in the plasma is between about 200 Gauss and about 1000 Gauss, such as between about 200 Gauss and about 500 Gauss, or between about 500 Gauss and about 1000 Gauss, or more than about 200 Gauss, more than about 500 Gauss, or more than about 800 Gauss.

In some embodiments, the lid assembly 104 further includes a motor 175 coupled to the magnetron assembly 165 by a rotatable shaft 167 which rotates to move the magnetron assembly 165 about an axis 124 during the deposition process. Rotating the magnetron assembly 165 during the deposition process desirably moves high ion density regions across the target surface to desirably allow more uniform erosion of carbon material from the face of the target 120 which improves the uniformity of the deposited amorphous carbon layer and desirably extends the life of the target 120. Typically, the magnetron assembly 165 is moved about the axis 124 at between about 10 rpm and about 200 rpm, such as between about 40 rpm and about 150 rpm. In other embodiments, the magnetron assembly 165 does not move during the deposition process. In some embodiments, a cooling fluid, such as water or a refrigerant is provided to the housing volume 166 by a cooling fluid source 168 in fluid communication therewith to cool the magnet and adjacent target.

The ground shield assembly 126 includes a ground frame 106 and a ground shield 112 coupled thereto, where the ground frame 106 electrically insulates the ground shield 112 from the target 120 while providing a ground path to the chamber body 108 through the sidewalls 110 thereof. In some embodiments, the ground shield assembly 126 further includes other chamber shield members, such as a target shield member, a dark space shield and dark space shield frame, and combinations thereof (not shown). Herein, the ground shield 112 helps constrain plasma generated during processing within an upper processing region 154 of the processing volume, where the upper processing region 154 is disposed between a substrate support 138, and a substrate 190 disposed thereon, and a surface of the target 120.

The magnetron housing 170 and the target 120 are operably coupled to a first power supply 132, which provides a high voltage pulsed DC power to the target 120.

Herein, the processing chamber 100 further comprises a controller 148 coupled thereto. The controller 148 herein includes a central processing unit (CPU) 160, a memory 158, and support circuits 162. The controller 148 is used to control the process sequence, regulate the gas flows from the gas source 128 into the processing chamber 100, bias the substrate 190 disposed on the substrate support 138, heat/cool and or maintain the substrate support 138 and/or the substrate disposed thereon at a desired temperature, and control ion bombardment of the target 120 by controlling the high voltage pulsed DC power provided to the target 120 and the magnetron housing 170 by the first power supply 132 and by controlling the speed of the magnetron assembly 165 about the axis 124. Herein, the CPU 160 is a general purpose computer processor configured for use in an industrial setting for controlling processing chamber and sub-processors related thereto. The memory 158 herein includes random access memory, read only memory, floppy or hard disk drive, or other suitable forms of digital storage, local or remote. Herein, the support circuits 162 are conventionally coupled to the CPU 160 and comprise cache, clock circuits, input/output subsystems, power supplies, and the like, and combinations thereof. In some embodiments, the controller 148 further includes one or more computer readable media (not shown).

Computer readable media herein includes any device, located either locally or remotely from the controller 148, which is capable of storing information that is retrievable by a computing device. Examples of computer readable media useable with embodiments of the present disclosure include solid state memory, floppy disks, internal or external hard drives, and optical memory (CDs, DVDs, BR-D, etc). In one embodiment, the computer readable media comprises the memory 158. Further, any connection is properly termed a computer-readable medium. For example, when instructions are transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Software routines, when executed by the CPU 160, transform the CPU into a specific purpose computer, herein the controller 148, that controls the operation of the processing chamber 100, such that the processes are performed in accordance with embodiments of the disclosure. In some embodiments, the software routines are stored and/or executed by a second controller (not shown) that is located remotely from the processing chamber 100. In other embodiments, the processes described herein, or portions thereof, are performed by one or more application specific integrated circuits (ASIC) or other types of hardware implementations. In some other embodiments, the processes described herein are performed by a combination of software routines, ASIC(s), and/or other types of hardware implementations.

Figure 1B:
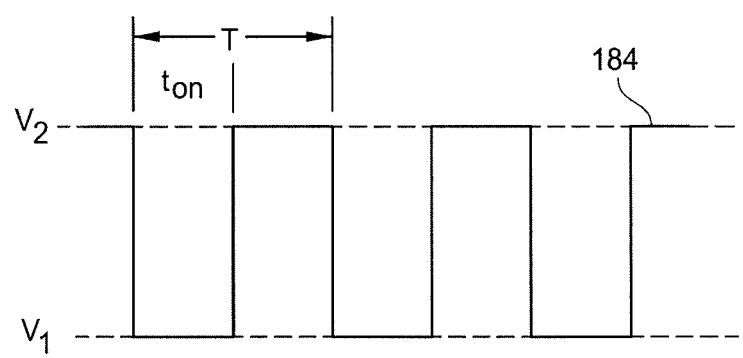
FIG. 1B illustrates a pulsed DC voltage, such as the pulsed DC voltage provided to the target disposed in a processing volume of the processing chamber described in FIG. 1A.

FIG. 1B illustrates a cyclic pulsed DC power 184, such as the high voltage pulsed DC power provided to the target 120 by the first power supply 132 shown in FIG. 1A. Herein, the cyclic pulsed DC power 184 cycles from a first voltage $V_1$ of between about −4 megavolts (MV) and about 0 V to a second voltage $V_2$ between about 1 MV and about 8 MV. The cyclic pulsed DC power 184 has a pulse duration, herein pulse active time $t_{on}$, between about 10 μs and about 40 μs or less than about 200 μs, such as less than about 100 μs, such as less than about 50 μs, for example less than about 35 μs and a cycle period T. Typically, the cycle period T is less than about 400 μs, such as less than about 300 μs, for example less than about 200 μs or a pulse repetition frequency of more than about 2500 Hz, such as more than about 3300 Hz, for example more than about 5000 Hz. As shown, the cyclic pulsed DC power 184 has a square wave shape, in other embodiments the cyclic pulsed DC power 184 has a non-square wave shape. Herein, an average DC power provided to the target during the pulse active time $t_{on}$ is between about 1 kW and about 11 kW for a target disposed in a processing chamber configured to process 300 mm diameter substrates. Appropriate scaling may be used for targets disposed in processing chambers configured to process different sized substrates where the average DC power during the pulse active time $t_{on}$ per cm² of a surface of the target is between about 1 W/cm² and about 20 W/cm², such as between about 1.4 W/cm² and about 16 W/cm².

Figure 2:
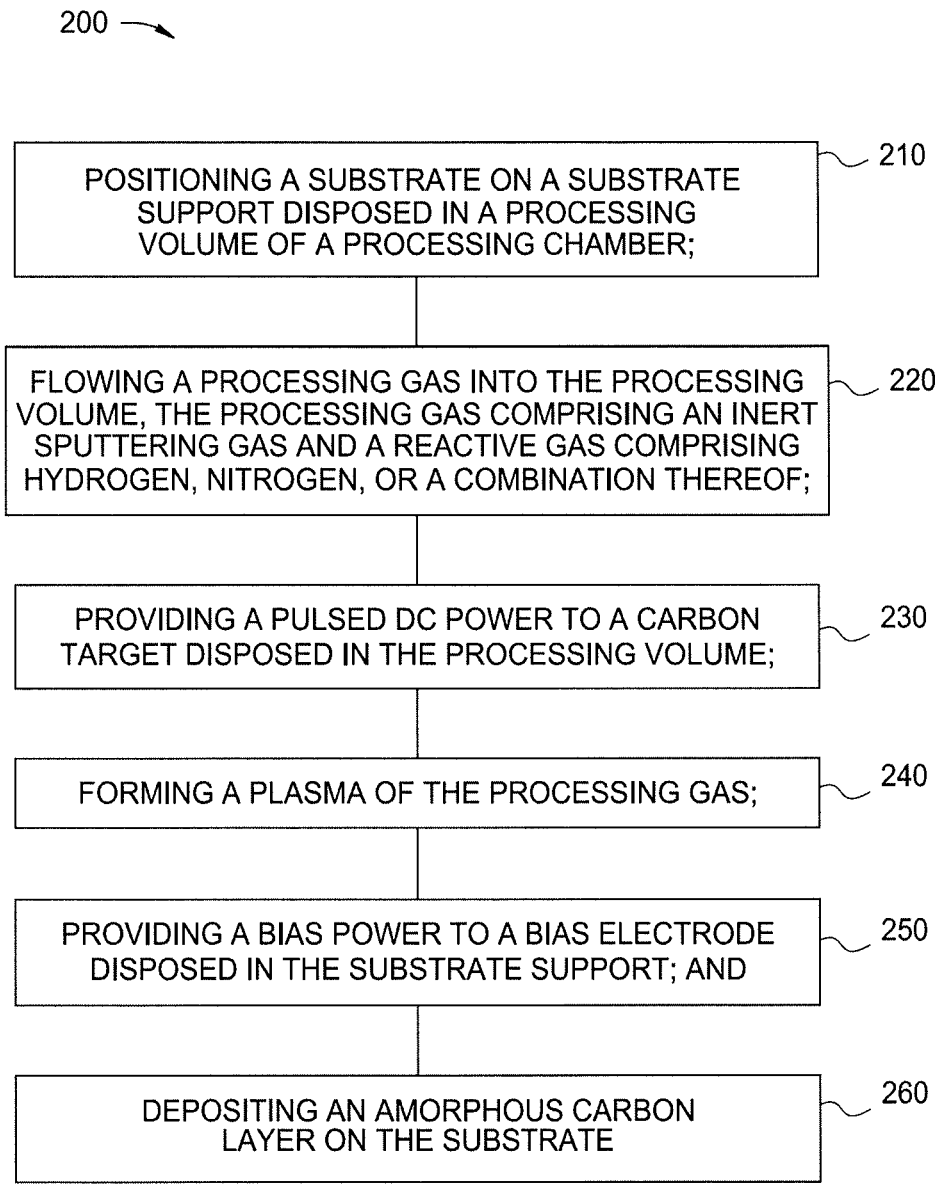
FIG. 2 is a flow diagram illustrating a method of depositing an amorphous carbon layer onto a substrate, according to one embodiment.

FIG. 2 is a flow diagram illustrating a method 200 of depositing an amorphous carbon layer onto a substrate, according to one embodiment. FIGS. 3A-3E illustrate the formation of an amorphous carbon hardmask using the method 200.

Figure 3A:
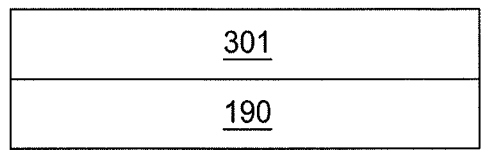
FIGS. 3A-3E illustrate the formation of an amorphous carbon hardmask, deposited using the method described in FIG. 2.

At activity 210, the method 200 includes positioning a substrate, such as the substrate 190 shown in FIG. 3A, on a substrate support disposed in a processing volume of a processing chamber. Herein, the substrate 190 and/or one or more material surfaces 301 thereon are formed of a material comprising crystalline silicon, silicon oxide, silicon oxynitride, silicon nitride, strained silicon, silicon germanium, tungsten, titanium nitride, doped or undoped polysilicon, carbon doped silicon oxides, silicon nitrides, doped silicon, germanium, gallium arsenide, glass, sapphire, low k dielectric materials, or combinations thereof. In some embodiments, the material surface 301 of the substrate 190 comprises a low-k dielectric material, such as a low-k carbon containing dielectric layer, a porous silicon oxycarbide low-k, an ultra low-k dielectric layer, or a combination thereof. In some embodiments, the substrate 190 is crystalline silicon. In some embodiments, positioning the substrate 190 on the substrate support comprises providing a chucking power to a chucking electrode embedded in a dielectric material of the substrate support.

At activity 220, the method 200 includes flowing a processing gas into the processing volume. Herein, the processing gas comprises an inert gas and a reactive gas. Inert gases herein include Ar, He, Ne, Kr, Xe, or a combination thereof. The reactive gas includes a hydrogen source gas, a nitrogen source gas, or a combination thereof. In one embodiment, the reactive gas comprises a hydrogen source gas such as $H_2$, hydrogenated carbon gas, or a combination thereof, where hydrogenated carbon gases include $CH_4$, $C_2H_2$, $C_3H_8$, $C_4H_{10}$, $C_2H_4$, $C_3H_6$, $C_4H_8$, and $C_5H_{10}$, or a combination thereof. In another embodiment, the reactive gas comprises a nitrogen source gas, such as $N_2$, $NH_3$, or a combination thereof. Typically, the processing gas comprises between about 5% and about 95% hydrogen source gas, nitrogen source gas, or a combination thereof, such as between about 5% and about 50%, such as between about 5% and about 40%, for example between about 20% and about 40% or more than about 20%. In one embodiment, the processing gas comprises Kr and $N_2$ or Kr and $H_2$. Typically, a processing pressure in the processing volume is maintained between about 1 mTorr and about 1 Torr, such as less than about 1 Torr, or such as between about 1 mTorr and about 500 mTorr, during the deposition process.

At activity 230, the method 200 includes providing a pulsed DC power to a target disposed in the processing volume. In some embodiments, the pulsed DC power comprises a voltage between about 1 MV and about 8 MV. Typically, an average pulse duration, herein a pulse active time, of the pulsed DC power is between about 10 μs and about 200 μs. In some embodiments, the average DC power per cm² of the sputterable surface of the target is between about 1 W/cm² and about 20 W/cm², such as between about 1.4 W/cm² and about 16 W/cm² for each pulse cycle. In embodiments herein, the target comprises a carbon containing material, such as graphite, amorphous carbon, sp2 type carbon materials, or combinations thereof, which is bonded to a metallic backing plate with an adhesive or by other conventional means.

At activity 240, the method 200 includes forming a plasma of the processing gases and at activity 250 the method 200 includes providing a bias power to a bias electrode disposed in the dielectric material of the substrate support. In one embodiment, the bias power is a pulsed RF bias power having an average pulse duration of between about 10 μs and about 200 μs, such as between about 10 μs and about 100 μs, such as between about 10 μs and about 50 μs, for example between about 10 μs and about 25 μs and an on-time duty cycle between about 10% and about 90%, such as between about 30% and about 70%. In one embodiment, an average RF bias power per cm² of a surface of the substrate 190 is between about 0.028 W/cm² and about 1.415 W/cm², such as between about 0.028 W/cm² and about 0.71 W/cm², for example about 0.21 W/cm² for each pulse cycle. In other embodiments, the RF bias power is provided in a continuous wave (CW).

Figure 3B:
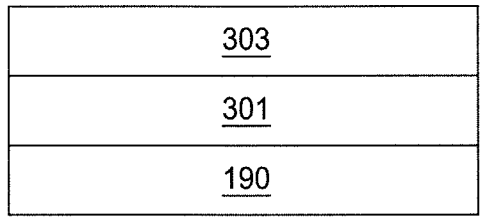

At activity 260, the method 200 includes depositing an amorphous carbon layer onto the substrate, such as the amorphous carbon layer 303 shown in FIG. 3B. In one embodiment, the amorphous carbon layer has a thickness between about 800 Å and about 16 kÅ, for example less than about 2 kÅ, such as less than about 1 kÅ, or more than about 4 kÅ, such as more than about 5 kÅ, or more than about 6 kÅ.

Figure 3C:
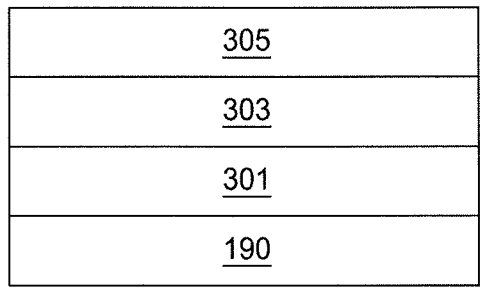
Figure 3D:
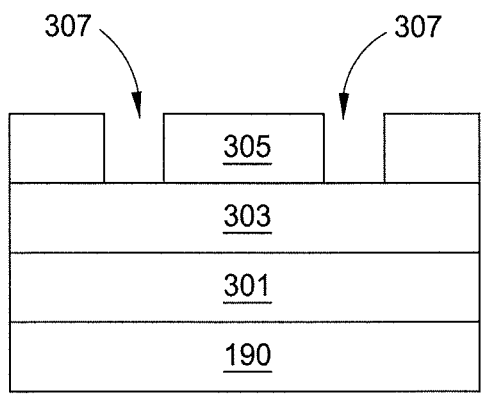
Figure 3E:
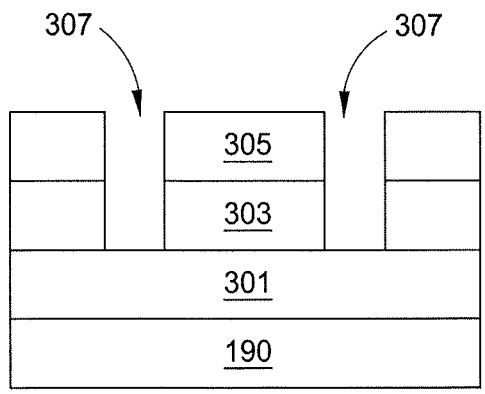

In other embodiments, the method 200 further includes depositing a patterning layer, such as the patterning layer 305 shown in FIG. 3C, on the amorphous carbon layer 303. Herein, the patterning layer 305 is formed in a different deposition chamber than that used to deposit the amorphous carbon layer 303 using conventional deposition methods, such as CVD or PVD, and comprises silicon oxide, silicon nitride, amorphous silicon, or a combination thereof. In some embodiments, the method 200 further includes forming a plurality of openings 307 through the patterning layer 305, as shown in FIG. 3D, to form a pattern and transferring the pattern to the amorphous carbon layer 303 by extending the plurality of openings 307 therethrough as shown in FIG. 3E. Herein, conventional photolithography and/or etch methods are used to form the plurality of first openings to form the pattern, to transfer the pattern to the amorphous carbon layer, and to form the plurality of second opening through the amorphous carbon layer.

The method 200 described above provides for the deposition of an amorphous carbon layer using high power impulse magnetron sputtering (HIPIMS). By biasing the substrate and adding a nitrogen or hydrogen source gas to the inert gas, an amorphous carbon layer is formed with higher density, higher etch resistance, improved roughness, optical K, and stress, when compared to amorphous carbon layers formed using conventional PVD methods.

In another embodiment, a carbon hardmask is provided. The carbon hardmask comprises an amorphous carbon layer disposed on a substrate, wherein the amorphous carbon layer has a thickness between about 1 kÅ and about 16 kÅ, a density of between about 2.0 g/cm³ and about 2.4 g/cm³, a hardness between about 15 GPa and about 20 GPa, an RMS surface roughness of less than about 1.5 nm, an absorption coefficient (optical k) value of less than about 0.3 at a wavelength of about 633 nm, a compressive film stress of less than about 2000 MPa, a Young's modulus of between about 100 GPa and about 300 GPa, and a substantially columnar free morphology. In some embodiments, the amorphous carbon layer has a hardness of more than about 15 GPa, such as more than about 16 GPa, for example more than about 17 GPa. In some embodiments, the amorphous carbon layer has an RMS surface roughness less than about 1 nm, less than about 0.5 nm, for example less than about 0.25 nm. In some embodiments, the amorphous carbon layer has an absorption coefficient (optical k) value of less than about 0.25 at a wavelength of about 633 nm, less than about 0.20, for example less than about 0.17, or about equal to 0.15. In some embodiments, the amorphous carbon layer has a compressive film stress between about 1000 MPa and about 2000 MPa, such as between about 1000 MPA and about 1500 MPA, such as less than about 1500 MPa, or less than about 1200 MPa. Herein, the amorphous carbon layer has a Young's modulus of between about 150 GPa and about 250 GPa, or more than about 150 GPa, or less than about 250 GPa. In some embodiments, the amorphous carbon layer has a plurality of openings formed therethrough, wherein each of the plurality of openings have an aspect ratio (height to width) of more than about 2:1, such as more than about 3:1, more than about 4:1, more than about 5:1, more than about 6:1, more than about 7:1, more than about 8:1, more than about 9:1, for example more than about 10:1.

Typically, the amorphous carbon layers deposited according to embodiments herein have a desirably substantially columnar free morphology when compared to amorphous carbon layers deposited without a reactive gas which typically have an undesirable columnar morphology. Examples of amorphous carbon layers having a substantially columnar morphology and substantially columnar free morphology are shown in FIGS. 4A and 4B respectively.

Figure 4A:
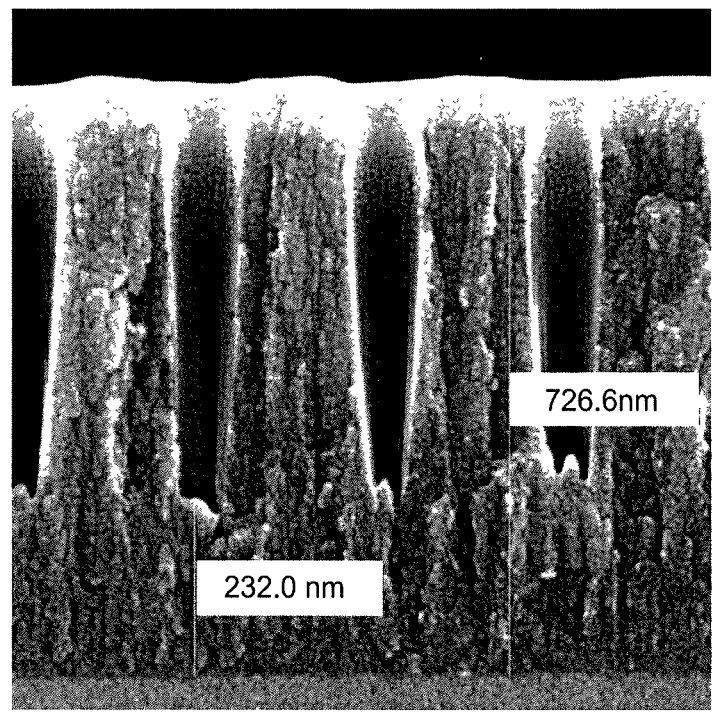
FIG. 4A shows a scanning electron microscope (SEM) image of a partially etched amorphous carbon hardmask deposited using a pure Kr HiPIMS process (without a reactive gas) where the amorphous carbon layer shows a substantially columnar morphology, according to one embodiment.
Figure 4B:
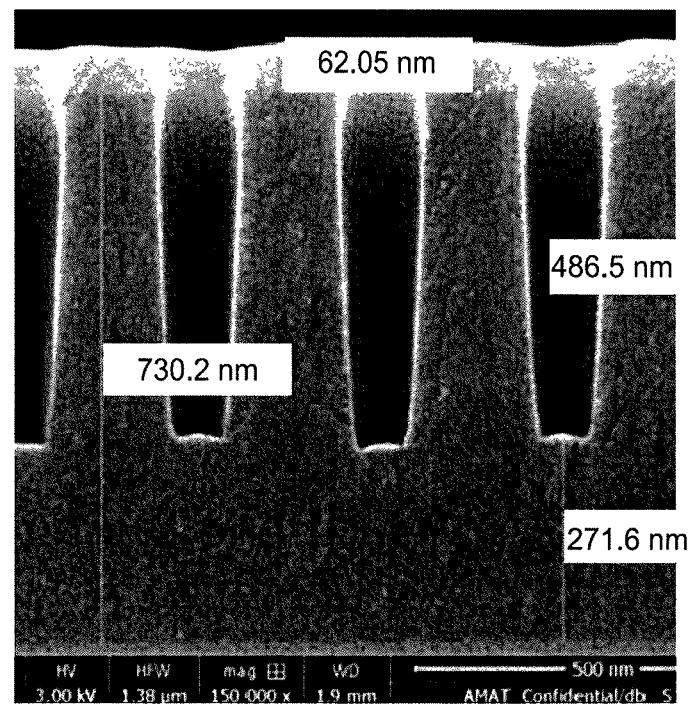
FIG. 4B shows a scanning electron microscope (SEM) image of a partially etched amorphous carbon hardmask, deposited according to an embodiment described herein, wherein the amorphous carbon layer shows a substantially columnar free morphology.

FIG. 4A shows a scanning electron microscope SEM image 400 of a partially etched amorphous carbon hardmask deposited using a pure Kr HiPIMS process (without a reactive gas) where the amorphous carbon layer shows a substantially columnar morphology. As further seen in FIG. 4A, the substantially columnar morphology of the amorphous carbon hardmask 400 causes undesirable profile and CD distortion in the openings etched therein. FIG. 4B shows an SEM image 401 of a partially etched amorphous carbon hardmask, deposited according to an embodiment described herein, where a ratio of inert gas to reactive gas, herein Kr to $N_2$, is about 3:1. As seen in FIG. 4B, the addition of $N_2$ during the HiPIMS deposition process provides an amorphous carbon layer having a substantially columnar free morphology. As further seen in FIG. 4B, the substantially columnar free morphology results in smoother etch profiles and fewer distortions of the openings etched therein.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, comprising:
   positioning the substrate on a substrate support disposed in a processing volume of a magnetron sputtering processing chamber;
   flowing a processing gas into the processing volume, the processing gas comprising an inert gas and a reactive gas comprising $N_2$, $NH_3$, or a combination thereof;
   applying a pulsed DC power to a carbon target disposed in the processing volume, wherein the pulsed DC power comprises a voltage pulse between about 1 MV and about 8 MV, and wherein an average DC power provided to the carbon target during a pulse active time is between about 1 W/cm$^2$ and about 20 W/cm$^2$;
   forming a plasma of the processing gas;
   applying a bias power to a bias electrode disposed in the substrate support, wherein the bias power is a pulsed RF bias power between about 0.0283 W/cm$^2$ and about 1.45 W/cm$^2$; and
   depositing an amorphous carbon layer on the substrate.

2. The method of claim 1, wherein the magnetron sputtering processing chamber comprises a chamber lid assembly, comprising:
   the carbon target bonded to a metallic backing plate;
   a magnetron housing coupled to the metallic backing plate, wherein the metallic backing plate and the magnetron housing define a housing volume;
   a magnetron assembly disposed in the housing volume; and
   a motor coupled to the magnetron assembly by a rotatable shaft.

3. The method of claim 1, wherein an average pulse active time of the pulsed DC power is between about 10 µs and about 200 µs.

4. The method of claim 1, wherein the inert gas comprises Kr and the reactive gas comprises $N_2$.

5. The method of claim 1, wherein the pulsed RF bias power has an average pulse duration of between about 10 µs and about 200 µs.

6. The method of claim 1, wherein the processing gas comprises between about 5% and about 95% of the reactive gas.

7. The method of claim 2, wherein the plasma is exposed to a magnetic field having a strength between about 200 Gauss and about 1000 Gauss.

8. The method of claim 1, wherein the inert gas comprises Kr.

9. The method of claim 1, further comprising maintaining the substrate at a temperature less than about 200° C.

10. The method of claim 2, further comprising rotating the rotatable shaft at between about 10 rpm and about 200 rpm.

11. The method of claim 1, further comprising:
    depositing a patterning layer on the amorphous carbon layer, wherein the patterning layer comprises silicon oxide, silicon nitride, amorphous silicon, or combinations thereof; and
    forming a plurality of openings through the amorphous carbon layer.

12. The method of claim 4, further comprising:
    maintaining the substrate at a temperature less than about 200° C.; and
    exposing the plasma to a magnetic field having a strength between about 200 Gauss and about 1000 Gauss, wherein
    pulsed RF bias power has an average pulse duration of between about 10 µs and about 200 µs.

13. A method of depositing an amorphous carbon layer, comprising:
    positioning a substrate on a substrate support disposed in a processing volume of a magnetron sputtering processing chamber, the processing chamber comprising one or more sidewalls, a chamber bottom, and a lid assembly that define the processing volume, wherein the lid assembly comprises:
    a carbon target bonded to a metallic backing plate;
    a magnetron housing coupled to the metallic backing plate, wherein the metallic backing plate and the magnetron housing define a housing volume;
    a magnetron assembly disposed in the housing volume; and
    a motor coupled to the magnetron assembly by a rotatable shaft;

flowing a processing gas into the processing volume, the processing gas comprising an inert gas comprising Ar, He, Ne, Kr, Xe, or combinations thereof, and a reactive gas comprising $N_2$, $NH_3$, or a combination thereof;

moving the magnetron assembly about an axis disposed through the rotatable shaft at between about 10 rpm and about 200 rpm;

providing a pulsed DC power to a target disposed in the processing volume, wherein the pulsed DC power comprises a voltage pulse between about 1 MV and about 8 MV, and wherein an average DC power provided to the target during a pulse active time is between about between about 1 $W/cm^2$ and about 20 $W/cm^2$;

forming a plasma of the processing gas;

providing a pulsed RF bias power to a bias electrode disposed in the substrate support, wherein the pulsed RF bias power is between about 0.0283 $W/cm^2$ and about 1.45 $W/cm^2$;

maintaining the substrate at a temperature less than about 200° C.; and depositing the amorphous carbon layer on the substrate.

\* \* \* \* \*

UNITED STATES PATENT AND TRADEMARK OFFICE
CERTIFICATE OF CORRECTION

PATENT NO. : 10,570,506 B2
APPLICATION NO. : 15/820777
DATED : February 25, 2020
INVENTOR(S) : Bhargav Citla et al.

Page 1 of 1

It is certified that error appears in the above-identified patent and that said Letters Patent is hereby corrected as shown below:

In the Specification

In Column 3, Line 64, delete "$C_6H_{10}$," and insert -- $C_5H_{10}$, --, therefor.

In Column 10, Line 55, delete "kA" and insert -- kÅ --, therefor.

In the Claims

In Column 12, Line 50, in Claim 12, before "pulsed" insert -- the --.

In Column 13, Lines 12-13, in Claim 13, delete "between about between about" and insert -- between about --, therefor.

Signed and Sealed this
Fifth Day of May, 2020

Andrei Iancu
*Director of the United States Patent and Trademark Office*